United States Patent [19]

LaViolette et al.

[11] Patent Number: 5,513,071
[45] Date of Patent: Apr. 30, 1996

[54] ELECTRONICS HOUSING WITH IMPROVED HEAT REJECTION

[75] Inventors: Kerry D. LaViolette, Liverpool; Robert F. Uhl, Manlius, both of N.Y.; Lucius T. Vinkenvleugel, Eindhoven, Netherlands

[73] Assignee: Philips Electronics North America Corporation, New York, N.Y.

[21] Appl. No.: 345,166

[22] Filed: Nov. 28, 1994

[51] Int. Cl.$^6$ ........................................ H05K 7/20
[52] U.S. Cl. .................... 361/703; 165/80.3; 257/722; 454/184
[58] Field of Search .................. 174/15.1, 16.1, 174/16.3; 62/408; 165/122, 126, 128, 185, 80.3, 901, 903; 361/690, 692, 694, 702, 703, 704, 707, 717–719; 454/184; 257/706, 707, 712, 713, 721, 722, 723, 724

[56] References Cited

U.S. PATENT DOCUMENTS

| | | |
|---|---|---|
| 336,074 | 7/1993 | Friend et al. . |
| 4,027,206 | 5/1977 | Lee ........................................ 361/384 |
| 4,237,521 | 12/1980 | Denker . |
| 5,065,278 | 11/1991 | Schultz .................................. 361/383 |
| 5,105,336 | 4/1992 | Jacoby .................................. 361/383 |
| 5,150,278 | 9/1992 | Lynes et al. . |
| 5,398,159 | 3/1995 | Andersson .............................. 361/695 |

Primary Examiner—Gerald P. Tolin
Attorney, Agent, or Firm—David R. Treacy

[57] ABSTRACT

A rack of electronic equipment is convection cooled. Each unit in the rack has oblique cooling fins oriented in a same direction, to cause heated air to flow to a hot air pathway by a chimney effect, and to draw surrounding air along a cool air pathway to each of the units. A preferred unit has two housing sections thermally insulated from each other. Each housing section has its cooling fins on a side surface, some of the fins being aligned with fins on the other section, so that cooling air flows first over the cooler section and then over the hotter section. The cooler section is arranged for enhanced heat transfer from a heat sensitive element, and heat liberating units are heat sinked to the hotter section.

20 Claims, 3 Drawing Sheets

ELECTRONICS HOUSING WITH IMPROVED HEAT REJECTION

BACKGROUND OF THE INVENTION

1. Field of the Invention

The invention relates to enclosed units, such as electronics or opto-electronics units, which liberate heat that must be rejected to the environment through the walls of the housing which encloses the unit. The invention has particular applicability to equipments having a plurality of units of this type which are mounted one above the other in a rack or cabinet (for simplicity, hereafter referred to simply as a rack).

An especially advantageous application of the invention is to units which contain one or more components which have a poor tolerance for elevated temperatures, and other components which liberate relatively large amounts of heat. It has long been known to locate the heat sensitive components away from and preferably lower than the hot, heat liberating components. However, when such units are mounted one above another in a rack, heat from the lower units tends to affect the units near the top of the cabinet adversely.

2. Description of the Prior Art

The use of integral fins to increase surface area and promote cooling goes far back in the age of machinery. Enough heat is liberated in machinery because of friction, thermodynamic or other processes so that some structure besides the basic machine parts was required to enhance cooling by the surrounding air. Devices like air compressors have long been made with fins cast onto the cylinders. Such fins generally extend radially and longitudinally, or radially in planes perpendicular to the cylinder axis.

When significant cooling is required, but it is desirable to rely on natural convection to provide flow of air over the fins, it was recognized very early that a vertical fin arrangement would provide the best air flow. However, for simplicity in manufacture, fins were generally aligned with the principal dimensions of the object.

With the advent of the electronics age, cooling of individual components became a problem. Copper oxide rectifier stacks were made with very large disc cooling fins between diodes of the stack. Some high power tubes were made with integral cooling fins, generally lying in longitudinally extending radial planes. With such tubes it was important that they be mounted in a vertical attitude.

With the development of power transistors, the first cooling improvement was radial fin devices that could be slipped over a transistor can. Later the higher power transistors were made such that the can was held against a large plate at the outside rear of an apparatus, and the plate had a number of vertical cooling fins on its exterior.

U.S. Pat. No. 4,237,521 teaches the use of a diagonal fin arrangement to facilitate cooling of a wall used as a heat sink for components such as transistors in a radio receiver. These transistors are generally mounted in intimate thermal contact with the heat sink. By arranging the fins obliquely to the vertical, adequate convection cooling could be provided for intermittent use; while for continuous use forced air cooling could be obtained by a fan placed behind the unit to withdraw heated air horizontally.

Another use of oblique fins is demonstrated in design U.S. Pat. No. 336,074. A CATV equipment housing is made of two cast sections, and has fins on all sides. On the two major walls the fins extend diagonally between the fins on the other sides of the housing.

A further improvement in cooling effectiveness is claimed for a fin design shown in U.S. Pat. No. 5,150,278. Here the fins are aligned in rows on one major surface having a long dimension, diagonal to the long dimension, and are interrupted by gaps which define angle channels oriented parallel to the long dimension, 30° to 60° from the row channels. This arrangement is described as providing improved air flow along the row channels because of reduced friction, and also allowing extra air flow along the angle channels. This housing is intended for mounting with the finned surface in a vertical plane, but the long dimension may be either vertical, such as when the unit is in a "pillar" enclosure, or horizontal, such as when the unit is hung from a wire stretched between poles. Cable connections to the unit are made at opposite ends, so that in a pillar mount one connector is in the top surface and the cable arches up away from the unit.

The CATV housing described in the '278 patent clearly is intended for use alone, so that no provision is made to preventing overheating of the top unit of a stack. If units, especially units like that shown in the '521 patent, are rack mounted, the only solution to high ambient temperatures around the top of a rack or cabinet has been to provide forced air cooling. This is disadvantageous because of cost, noise, and reliability considerations for small high speed fans.

SUMMARY OF THE INVENTION

According to the invention, heat-liberating units which have fins arranged obliquely on vertical surfaces are mounted as a vertical stack in a rack. Although the units of the stack may not all be of a same type, the oblique fins of units which are generally above each other should be inclined in the same direction. The rack has a space extending past the units of the stack, adjacent the upper ends of at least some of the fins, which defines a pathway producing a chimney effect for upward flow of heated air from the upper ends of the fins; and the rack is arranged to define a pathway for unheated surrounding air to lower ends of at least some of the fins on all these units. If a group of vertically aligned units are double sided (that is, have fins on two sides of each unit) then the dimensions of these units in plan view need merely be sufficiently similar that the oblique flow of air between the pathways is maintained effectively.

For cleanliness and comfort of people who service or must have access to the units, it is advantageous to arrange the rack so that the hot air chimney is at the rear. Fronts of the individual units may be exposed to the surrounding air, or may be behind a cabinet door which defines a path for cool ambient air to flow to each of the units. However, in specific installations the relative positions of cool and hot pathways may be different.

According to another aspect of the invention, each of the unit housings is divided into two or more sections which are connected to each other by a thermally insulating structure, such as a thin metal cover, or internal printed circuit boards and brackets, or a structure whose sole function is to interconnect the sections. The fins are attached to, or integral with, thermally conductive plates or castings which form generally vertical wall portions. The finned wall portions are separated from each other by gaps which may or may not be filled by a thermally isolating gasket.

One section, which may for simplicity be called the cool section, has one or more heat sensitive elements mounted within it or arranged with enhanced heat transfer to the cool section. The most high-temperature-resistant heat-liberating units are mounted within, or with enhanced heat transfer to, another section (the "hot" section). Where more than two sections are provided, the cooling air temperature will be progressively hotter as the air flow is considered from that adjacent the cool section to the hot section.

Preferably, at least some of the fins on the cool section are aligned with but spaced from some of the fins on the next section, so that they define a channel where fins on the next section draw surrounding air over corresponding fins on the cool section as the air travels upward and toward the hot section. However, it is not necessary that the fins be straight, or that fins on adjoining sections have exactly the same spacing or angle of obliquity. For example, where more than two sections are involved, it may be that for reasons of circuit layout an intermediate section dissipates very little heat. To reduce air flow friction or obtain improved separation of warm air and hot air paths, fins on an intermediate section may be thinner and spaced farther apart, such as twice as far apart; or may even be eliminated entirely.

A housing according to this aspect of the invention has the advantage that air flow, caused by the hot fins of the hot section, improves the cooling of the cool section. This effect becomes particularly significant when, according to a third aspect of the invention, units of this type are stacked in a rack as described above. In this situation the cool sections will be stacked generally above each other, while at least some of the heated air from the fins on the hot sections will flow upward through the hot air pathway rather than over the fins of the next unit above. This chimney effect can be so pronounced that air velocity over the fins is significantly increased, and the temperature of the cool sections is maintained even lower than when one unit is by itself.

Finned housing sections are most commonly and economically cast from aluminum, so that the fins are integral with the housing. Excellent thermal isolation between adjoining sections can be obtained even with inexpensive gaskets such as a thermoplastic like nylon, while maintaining a dust-tight seal whenever this may be desirable. At the same time, in a CATV unit RF leakage can be maintained within reasonable limits so long as the gap between the sections is small in comparison with the wavelength of the signals involved.

DESCRIPTION OF THE PREFERRED EMBODIMENT

Figure 1:
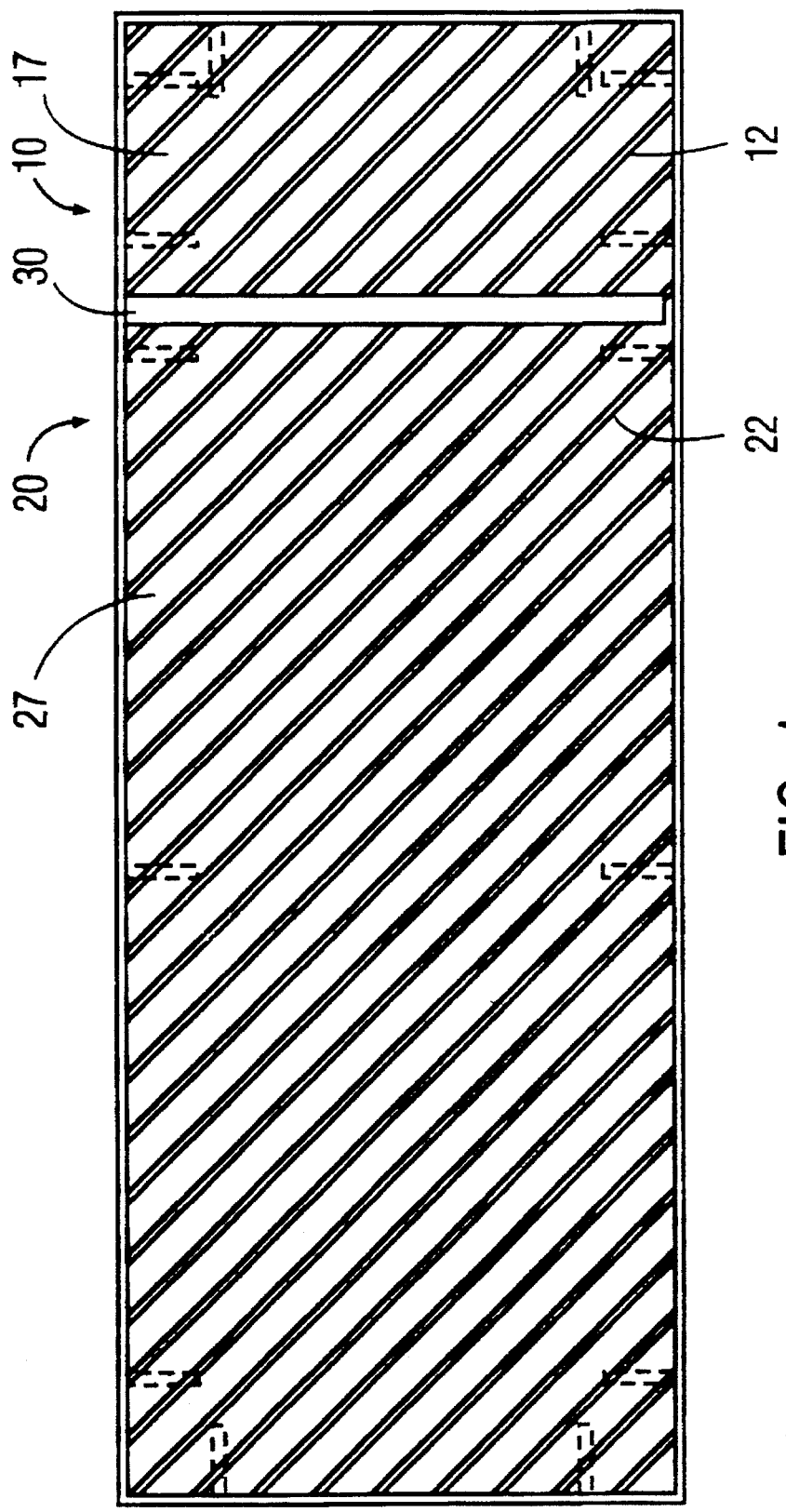
FIG. 1 is a diagrammatic side view of a unit according to the invention.
Figure 2:
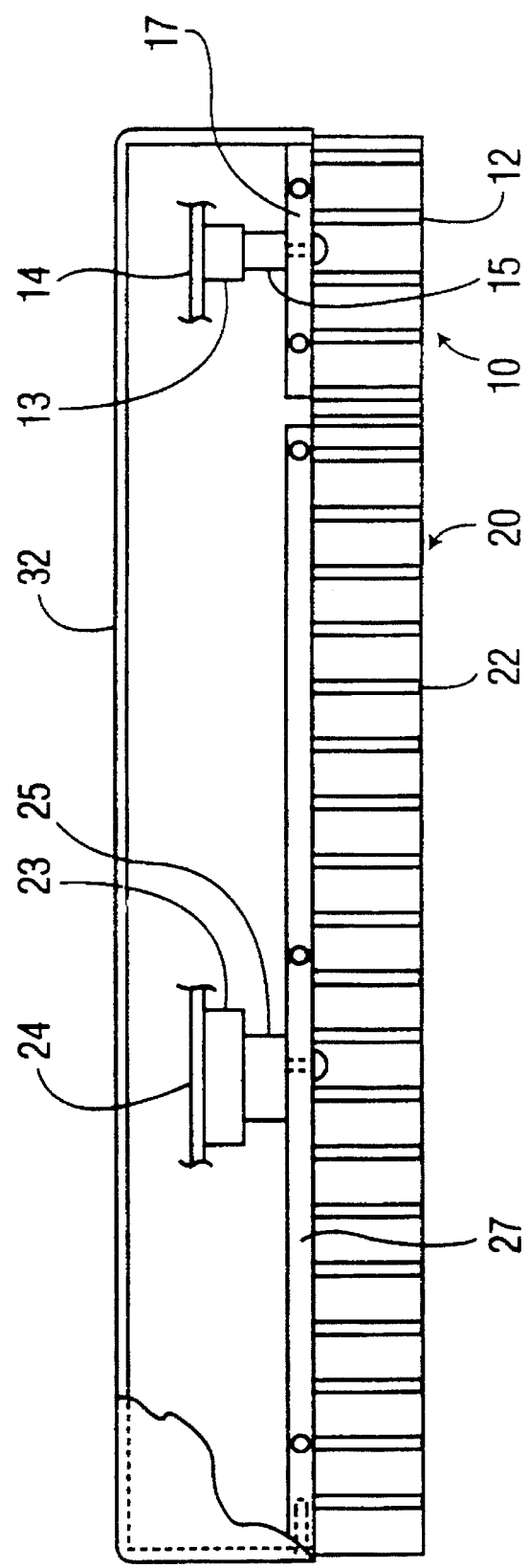
FIG. 2 is a top view of the unit of FIG. 1.

The telecommunication unit shown in FIGS. 1 and 2 may be used for CATV/Telephony transmission and reception, handling signals at frequencies from 5 Mhz to 1 Ghz. At one end a housing cool section 10 is provided with equally spaced cooling fins 12 extending upwardly and rearwardly. Within this end a laser diode 13 (shown schematically), whose performance will be seriously impaired if its temperature exceeds 65° C., is mounted on a PC board 14, via a heat sink 15 which is fastened by a screw or more permanent means to a wall portion or plate 17 on which the fins 12 are formed. This configuration enhances heat transfer from the diode to the housing section 10 and then to the cooling air flow.

To the rear of the cool section 10, a housing hot section 20 is also provided with equally spaced cooling fins 22 extending upwardly and rearwardly. Within this end a plurality of transistors 23 (one of which is shown, schematically) are mounted on a PC board 24. These transistors have heat sinks 25 which are attached to a wall portion or plate 27 of the housing section 20 by screws, to enhance heat transfer from the transistors to the housing section.

Preferably, the side plates 17 and 27 are each formed by casting from an easy-casting aluminum alloy. To minimize conductive heat transfer from the hot section 20 to the cool section 10, while maintaining a dust-tight enclosure, the two side plates are separated by a thermally insulating gasket 30 made of an inexpensive thermoplastic material such as nylon. Alternatively, the gasket may be eliminated, and a simple gap or open slot may separate the two side plates. As seen clearly in FIG. 1, the fins 12 are aligned with, but spaced from, the fins 22 so that they define cooling air flow channels.

To provide a rigid surface for mounting cable sockets, the hot section side plate 27 may include an end portion perpendicular to the side wall. Similarly, the cool section side plate 17 can include an end portion. This is especially desirable if a cable socket should be placed close to the diode 13. If the side plates are mechanically connected by an insulating or low conductivity internal structure, then all electrical assembly can be performed easily before attachment of a cover.

To protect and enclose the circuit boards and components within the unit, a cover 32 is fastened to both side plates by screws. To reduce heat transfer to the diode 13, and to minimize cost, the cover 32 may be made of thin aluminum sheet material, and may also be perforated if dust-tightness is not required. Where the side plates include end portions, the cover then is easily formed by bending into a "U" shape. Those of ordinary skill will recognize that many additional expedients are available to reduce heat transfer from the cover or hot elements within the unit to the diode 13 or side plate 17, in any circumstances where this is needed. For example, a further gasket portion may be provided between the cover and the side plate 17; the inside of the cover 32 may be insulated at the cool end; or some thermal shielding may be provided around the cool end components to reduce convection air currents within the unit.

The dimensions of the thermally insulating gap or gasket will usually not be critical. Depending in part on the wall thicknesses, a gap length or gasket thickness might be as small as 0.5 mm (0.020") or even less. To reduce thermal transfer between the sections, the wall thickness can be reduced greatly adjacent the gap or gasket. To prevent excessive RF leakage, a maximum gap of approximately 1% of the shortest wavelength of concern will usually suffice. For critical applications, perforations in the cover may be omitted, or made very small. A shield plate or screen can bridge the gap, and can easily be made to minimize thermal conduction between the two side plates.

In the embodiment shown in FIG. 1 the cover 32 actually holds the cool section side plate 17 in position. It will be clear that this is just one of many construction expedients. As discussed above, an internal structure may interconnect the two side plates. Instead of making two separate side plates 17 and 27, it is possible to cast them as one piece, with a slot formed to provide two thin portions interconnecting cool end hot portions of the plate. Functionally the unit still has two housing sections.

Figure 3:
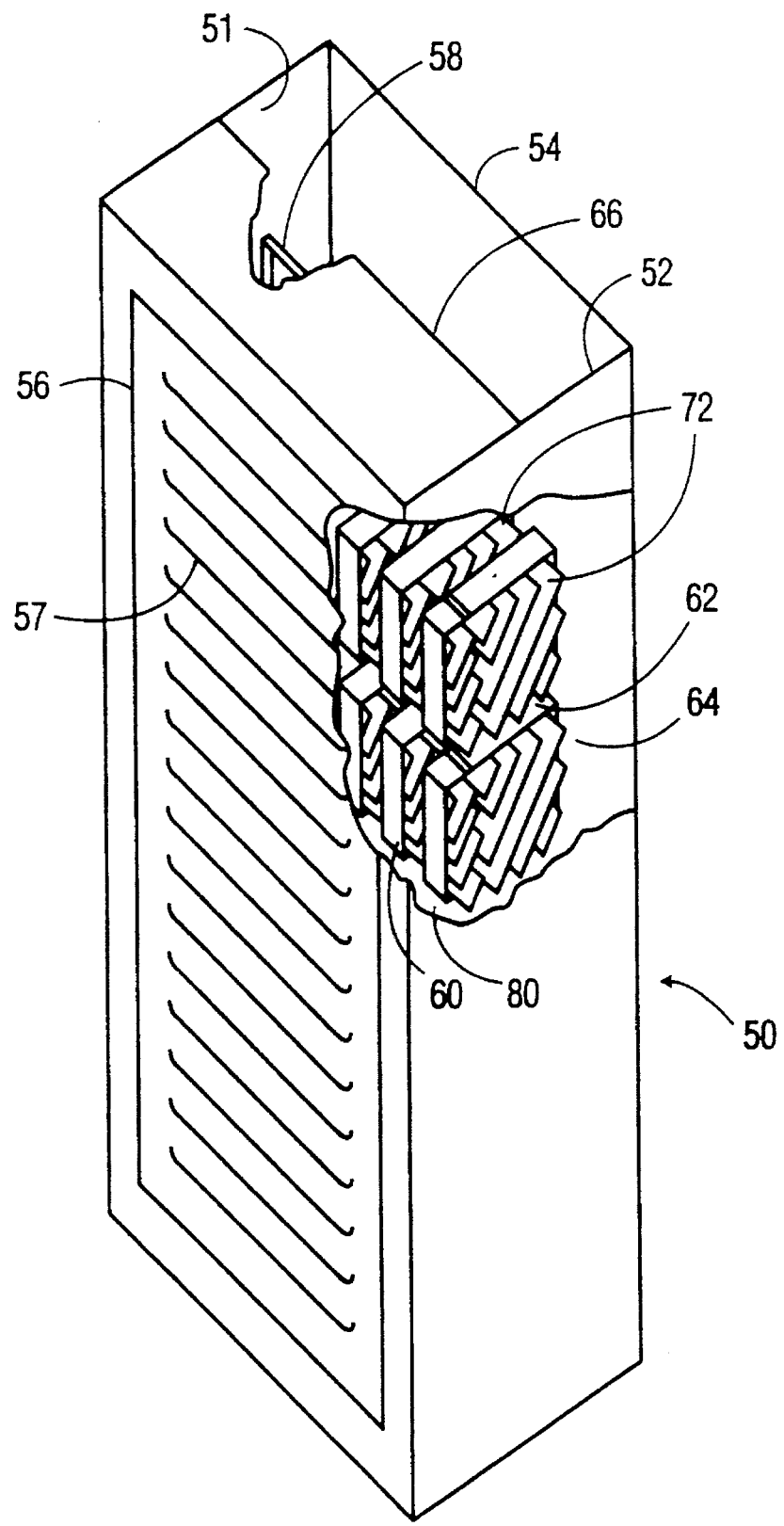
FIG. 3 is a perspective view of a rack according to the invention.

A semi-enclosed rack 50 for a large number of units, such as those of FIG. 1, is shown in FIG. 3. This design is suitable for units which have one cable connection (not shown) to the cool housing section, and one or more to the hot section.

The rack 50 has side walls 51 and 52, a rear wall 54, a front door 56 having louver openings 57, and an internal frame 58 including appropriate cross pieces for mounting rows of units 60, 62 one above the other. Between the rear surfaces of the units 60, 62 and the rear wall 54 a rear pathway 64 for air heated by the units 60 will provide a chimney effect, greatly increasing the cooling of the units. This rear pathway also provides space for cables (not shown) connecting to the units 60, 62. To aid in defining the chimney effect, the front portion of the cabinet may also have a top cover 66.

The units 60 may be identical to those shown in FIGS. 1 and 2. The units 62 are exemplary of a design for units with a higher heat dissipation, and have fins 72 on both sides. Such a unit may have separate castings for the two sides of the hot housing section, and one casting for the cool section.

The front door 56 provides access for any cables connected to the cool sections of the units 60, 62. The space between the front door 56 and the fronts (cool housing sections) of the units 60 and 62 forms a pathway 80 for surrounding air.

Many other variations will be apparent to those of ordinary skill upon reading this description. For example, the fins need not be straight. Curvature, or irregularities in the fin surfaces, or variation in fin thickness may be used to improve the overall cooling effect, or to increase thermal transfer to the air at one region of the channels compared with another. In some applications the fins may not be evenly spaced; or some or all of the spacings on one section may differ from those on the other. This last possibility necessarily implies that the fins or the two sections will not be fully in line with each other.

Alternatively, heat sensitive elements such as the diode 13 may be mounted adjacent to but not touching the cool housing section 10, or be located somewhat remotely from the plate 17. Where circuit considerations call for placing a heat sensitive component near a component in the hot section, a special advantage of the invention allows insulating the heat sensitive component somewhat from the hotter component in the hot section, and enhancing heat transfer from the temperature sensitive component to the cool section by a heat pipe or other high thermal conductivity element.

If it is desired to have ready access to the cable connectors, and these are all or mostly made to the hot sections, then the hot section may be at the housing front. This design requires that the door be kept closed except for brief maintenance periods; and that any louvers be confined to the extreme top or bottom. In such a case, it is advantageous that the rack be elevated above any floor, and that most cooling air enter the cabinetry toward the rear. Side to side cooling flow is also possible, and allows easy entry of cool air and exit of hot air, but this arrangement usually impairs access to units toward the rear of the cabinet.

What is claimed is:

1. A heat-liberating equipment, comprising:

a rack including means for mounting heat-liberating units as a vertical stack in the rack, and means for at least partially enclosing said rack, and a plurality of said heat-liberating units, mounted in said rack, each unit having a housing and at least one heat-liberating element mounted within said housing, each respective housing having a side surface extending generally vertically, each said side surface having a plurality of heat-dissipating fins protruding therefrom, each of said fins being inclined between approximately 30° and approximately 60° from vertical, and each of said fins having a respective lower end and an upper end, said heat-liberating units being arranged such that said side surfaces are aligned vertically above each other with the respective fins being inclined in the same direction, said rack being arranged to define a first pathway for flow of surrounding air to said lower ends of said fins, and a second pathway producing a chimney effect for upward flow of heated air from said upper ends, and the lower end of each of said fins being disposed remote from said second pathway, at a distance from the second pathway greater than the distance of the respective upper end from the second pathway.

2. An equipment as claimed in claim 1, characterized in that at least a group of said plurality of units have substantially similar external dimensions in plan view, and each of the units of said group are mounted in a vertical line, and have two said side surfaces extending parallel to each other, with the respective fins being substantially parallel to each other.

3. An equipment as claimed in claim 2, characterized in that said pathway for flow of surrounding air extends along a front of said rack, and said pathway for upward flow of heated air extends along a back of said rack.

4. A housing for a unit including a heat sensitive element and at least one heat-liberating element, comprising:

a first housing section and a second housing section each made of a material having high thermal conductivity, and thermally-insulating means for interconnecting said housing sections to form an enclosure for said elements, each respective housing section having a side surface extending generally vertically, said side surfaces being substantially co-planar, a respective plurality of substantially parallel heat-dissipating fins protruding from each of said side surfaces, each of said fins being inclined between approximately 30° and approximately 60° from vertical, respective fins on said first housing section having ends spaced from corresponding ends of the fins on said second housing section, said fins defining cooling air pathways extending obliquely upwardly along said side surfaces parallel to said fins, in a direction from said first section toward said second section, whereby upon mounting said heat sensitive element within said enclosure, providing means for enhancing heat transfer between said heat sensitive element and said first housing section, mounting said at least one heat-liberating element within said enclosure, and providing means for enhancing heat transfer between said at least one heat-liberating element and said second housing section, said heat sensitive element will be maintained at a temperature less than that of said second housing section when heat is being liberated by said heat-liberating element.

5. A housing as claimed in claim 4, characterized in that said housing sections each have two said side surfaces extending parallel to each other, with the respective fins being substantially parallel to each other.

6. A housing as claimed in claim 4, characterized in that the housing comprises said first and second housing sections only, said first and second housing sections adjoin each other, and at least one of said fins on said first housing section is substantially colinear with a corresponding one of said fins on said second housing section, arranged to define one side of a pathway for convection flow of air past a portion of said side of said first housing section and then past a corresponding portion of said side surface of said second housing section.

7. A housing as claimed in claim 6, characterized in that said first housing section and said second housing section each comprise a respective side plate on which said fins are formed, said material is aluminum, and said thermally insulating means includes a space between said side plates and a cover formed of a thin material.

8. A housing as claimed in claim 7, characterized in that said side plates and fins are formed as castings, and said thin material is aluminum.

9. A housing as claimed in claim 6, characterized in that said material is aluminum, and said thermally insulating means includes a gasket made of a thermoplastic material.

10. A telecommunications unit including a heat sensitive element and at least one heat-liberating element, comprising:

a first housing section and a second housing section each made of a material having high thermal conductivity, and thermally-insulating means for interconnecting said housing sections to form an enclosure for said elements, each respective housing section having a side surface extending generally vertically, said side surfaces being substantially co-planar, means for mounting said heat sensitive element within said enclosure, and means for enhancing heat transfer between said heat sensitive element and said first housing section, means for mounting said at least one heat-liberating element within said enclosure, and means for enhancing heat transfer between said at least one heat-liberating element and said second housing section, and a respective plurality of substantially parallel heat-dissipating fins protruding from each of said side surfaces, each of said fins being inclined between approximately 30° and approximately 60° from vertical, respective fins on said first housing section having ends spaced from corresponding ends of the fins on said second housing section, said fins defining cooling air pathways extending obliquely upwardly along said side surfaces parallel to said fins, in a direction from said first section toward said second section.

11. A unit as claimed in claim 10, characterized in that said housing sections each have two said side surfaces extending parallel to each other, with the respective fins being substantially parallel to each other.

12. A unit as claimed in claim 10, characterized in that the unit comprises said first and second housing sections only, said first and second housing sections adjoin each other, and at least one of said fins on said first housing section is substantially colinear with a corresponding one of said fins on said second housing section, arranged to define one side of a pathway for convection flow of air past a portion of said side of said first housing section and then past a corresponding portion of said side surface of said second housing section.

13. A unit as claimed in claim 12, characterized in that said first housing section and said second housing section each comprise a respective side plate on which said fins are formed, said material is aluminum, and said thermally insulating means includes a space between said side plates and a cover formed of a thin material.

14. A unit as claimed in claim 13, characterized in that said side plates and fins are formed as castings, and said thin material is aluminum.

15. A unit as claimed in claim 13, for operation at radio frequencies greater than 5 Mhz, characterized in that said space has a thickness at least approximately 0.5 mm and less than approximately 1% of the shortest wavelength.

16. A unit as claimed in claim 12, characterized in that said material is aluminum, and said thermally insulating means includes a gasket made of a thermoplastic material.

17. A telecommunications equipment, comprising:

a rack including means for mounting telecommunications units as a vertical stack in the rack, and means for at least partially enclosing said rack, and a plurality of said telecommunications units, mounted in said rack, wherein each said telecommunications unit includes a heat sensitive element and at least one heat-liberating element, characterized in that each telecommunications unit comprises:

a first housing section and a second housing section each made of a material having high thermal conductivity, and thermally-insulating means for interconnecting said housing sections to form an enclosure for said elements, each respective housing section having a side surface extending generally vertically, said side surfaces being substantially co-planar, means for mounting said heat sensitive element within said enclosure, and means for enhancing heat transfer between said heat sensitive element and said first housing section, means for mounting said at least one heat-liberating element within said enclosure, and means for enhancing heat transfer between said at least one heat-liberating element and said second housing section, and a respective plurality of substantially parallel heat-dissipating fins protruding from each of said side surfaces, each of said fins being inclined between approximately 30° and approximately 60° from vertical, respective fins on said first housing section having ends spaced from corresponding ends of the fins on said second housing section, each of said fins on the respective first housing sections having a lower end, and each of said fins on the respective second housing sections having an upper end, said fins defining cooling air paths extending obliquely upwardly along said side surfaces parallel to said fins, in a direction from said first section toward said second section, said telecommunications units being arranged such that said side surfaces are aligned vertically above each other with the respective fins being inclined in the same direction, said rack being arranged to define a first pathway for flow of surrounding air to at least said lower ends of said fins on said first housing sections, and a second pathway producing a chimney effect for upward flow of heated air from at least said upper ends of said fins on said second housing sections, and the lower end of each of said fins being disposed remote from said second pathway, at a distance from the second pathway greater than the distance of the respective upper end from the second pathway.

18. An equipment as claimed in claim 17, characterized in that said first pathway for flow of surrounding air extends along a front of said rack, and said second pathway for upward flow of heated air extends along a back of said rack.

19. An equipment as claimed in claim 17, characterized in that said plurality of units are substantially identical.

20. An equipment as claimed in claim 17, characterized in that at least a group of said plurality of units have substantially similar external dimensions in plan view, and each of the units of said group are mounted in a vertical line, and have two said side surfaces extending parallel to each other, with the respective fins being substantially parallel to each other.

* * * * *